United States Patent [19]

Martens, deceased et al.

[11] 4,127,452
[45] Nov. 28, 1978

[54] METHOD FOR THE MANUFACTURE OF A SUPERCONDUCTIVE $Nb_3Sn$ LAYER ON A NIOBIUM SURFACE FOR HIGH FREQUENCY APPLICATIONS

[75] Inventors: Hans Martens, deceased, late of Erlangen, Fed. Rep. of Germany, by Hildegard Martens, legal heir; by Harald Martens, legal heir, Erlangen, Fed. Rep. of Germany; by Rainer Martens, legal heir, Erlangen, Fed. Rep. of Germany; by Hans-Wolfgang Martens, legal heir, Aachen, Fed. Rep. of Germany; Günter Martens, legal heir, Buckenhof, Fed. Rep. of Germany; by Sigrid Martens, legal heir, Nuremberg, Fed. Rep. of Germany; by Hannelore Martens, legal heir; by Helmut Martens, legal heir, both of Erlangen, Fed. Rep. of Germany

[73] Assignee: Siemens Aktiengesellschaft, Berlin and Munich, Fed. Rep. of Germany

[21] Appl. No.: 797,234

[22] Filed: May 16, 1977

[30] Foreign Application Priority Data

Aug. 9, 1976 [DE] Fed. Rep. of Germany ....... 2635741

[51] Int. Cl.² .................. C25D 5/00; H01V 11/00
[52] U.S. Cl. .................. 204/38 A; 427/62; 427/250; 427/399; 29/599; 156/667; 427/248 A; 427/248 E; 427/383 D
[58] Field of Search .......... 427/62, 250, 63, 399, 427/383 D, 328, 248 A, 248 E; 204/26, 38 A, 56 R; 29/599; 156/667

[56] References Cited

U.S. PATENT DOCUMENTS

| 3,181,936 | 5/1965 | Denny | 427/62 |
| 3,317,286 | 5/1967 | Sorbo | 427/62 |
| 3,332,800 | 7/1967 | Saur | 427/62 |
| 3,397,084 | 8/1968 | Krieglstein | 29/599 |
| 3,409,468 | 5/1968 | Allen | 427/62 |
| 3,525,637 | 8/1970 | Kim | 427/62 |
| 3,576,670 | 4/1971 | Hammond | 427/62 |
| 3,630,769 | 12/1971 | Hart | 427/62 |
| 3,661,639 | 5/1972 | Caslaw | 427/62 |
| 3,784,452 | 1/1974 | Martens | 204/26 |
| 3,902,975 | 9/1975 | Martens | 204/35 N |

Primary Examiner—Michael F. Esposito
Attorney, Agent, or Firm—Kenyon & Kenyon, Reilly, Carr & Chapin

[57] ABSTRACT

A manufacturing method for depositing an $Nb_3Sn$ layer on a niobium surface for high frequency applications comprising developing a tin vapor atmosphere which also contains a highly volatile tin compound in the gaseous state, and holding the portions of the surface which are to be provided with the $Nb_3Sn$ layer at a temperature of between 900° and 1500° C for a predetermined period of time to form the $Nb_3Sn$ layer permitting niobium surfaces of any shape to be provided with $Nb_3Sn$ layers of high uniformity and quality.

15 Claims, 2 Drawing Figures

METHOD FOR THE MANUFACTURE OF A SUPERCONDUCTIVE Nb₃Sn LAYER ON A NIOBIUM SURFACE FOR HIGH FREQUENCY APPLICATIONS

BACKGROUND OF THE INVENTION

The invention relates to manufacturing of superconductive $Nb_3Sn$ layers on niobium surfaces for high frequency applications in general and more particularly to an improved method of manufacturing such layers by diffusing tin into the niobium surface at elevated temperature.

Superconductive devices for operation with electromagnetic high frequency fields, the frequencies of which extend to over 10 GHz, can be used as resonators and separators for particle accelerators and also as high frequency resonators for other purposes, e.g., as frequency standards. They can be designed for this purpose particularly as cavity resonators or resonator helices. Superconducting cavity resonators are generally operated in a frequency range of between 1 and 15 GHz, and superconducting resonator helices in the range around 100 MHz. Niobium and, on occasion, lead are provided as superconductor materials for such resonators.

In such superconducting devices, one strives for a high quality factor Q and also generally for a critical magnetic flux density $B_c^{ac}$, measured in the presence of high frequency fields as high as possible, so that the superconducting devices can be operated with a high frequency power as large as possible and at the same time with low surface resistance. For, if the critical magnetic flux density $B_c^{ac}$ is exceeded, the losses increase steeply, the surface resistance is increased considerably and the electromagnetic field breaks down. An upper limit for the critical magnetic flux density $B_c^{ac}$ in this connection is what is known as the dynamic critical flux density $B_c$. Since this flux density is higher for $Nb_3Sn$ than for pure niobium, a higher critical flux density $B_c^{ac}$ can be expected at an $Nb_3Sn$ surface than at a niobium surface. In addition, $Nb_3Sn$ also has a considerably higher critical temperature than niobium, so that its thermal stability is correspondingly higher. $Nb_3Sn$ is therefore suitable for higher operating temperatures than niobium. With $Nb_3Sn$ surfaces, operation at the temperature of boiling liquid helium, about 4.2 K, in particular, is therefore possible, while corresponding niobium surfaces must be operated at substantially lower temperatures due to their high frequency losses.

Therefore, thin layers of $Nb_3Sn$ have been applied on niobium resonators by first vapor depositing tin on the niobium resonator and then subjecting the latter to a heat treatment. With such surface layers, a $Q_o$ factor of about $10^9$ at 2.8 GHz and a critical magnetic flux density $B_c^{ac}$ of about 25 mT can be obtained (cf. "Siemens-Forschungs- und Entwicklungsberichte" (Research and Development Reports), vol. 3 (1974), page 96).

In such a method, the difficulty arises, however, that the vapor deposited tin melts at the beginning of the heat treatment and can easily run, for instance, in the case of inside coating of cavity resonators, along the inside surface to the lowest point of the cavity, before enough tin for forming an $Nb_3Sn$ layer of sufficient thickness diffuses into the niobium surface. In practice, only very thin tin layers can therefore be vapor deposited and the vapor deposition and subsequent heat treatment must be repeated several times so that a sufficient amount of tin can diffuse into the niobium surface to form the $Nb_3Sn$ layer.

It is further known to expose the niobium parts to be provided with an $Nb_3Sn$ layer to a tin vapor atmosphere in a closed reaction vessel, e.g., a sealed, evacuated quartz ampoule, at an elevated temperature of about 1000° C. The tin diffuses from the tin vapor atmosphere into the surface, forming the desired $Nb_3Sn$ layer. With this method, $Nb_3Sn$ layers several micrometers thick with $Q_o$ factors of about $10^9$ and critical magnetic flux densities of more than 40 mT can be obtained at 1.5 K ("IEEE Transactions on Magnetics", vol. MAG-11, No. 2, March 1975, pages 420 to 422). However, the sealed reaction vessel of this device must generally be destroyed in the opening after the coating. Since, for coating larger niobium parts, correspondingly large vessels, e.g., ampoules, are required, the known method is accordingly expensive. In addition, the gases produced in or after the sealing off remain enclosed in the reaction zone if one works with a sealed reaction vessel. These gases can lead to disturbances of the $Nb_3Sn$ layer. However, the quality of this $Nb_3Sn$ surface layer is of decisive importance, since the depth of penetration of the high frequency currents and fields into the superconductor surface is only about 0.1 to 0.2 $\mu m$.

To avoid these difficulties which arise in the case of sealed reaction vessels, open reaction chambers may also be provided, in which gases present or generated within the reaction zone can be drawn off. Here, the reaction zone must be sealed off to the extent that a tin vapor pressure sufficient for forming the $Nb_3Sn$ layer in a relatively short time is maintained even though the reaction chamber is open, and an excessive amount of tin is prevented from diffusing away.

In the last mentioned cited methods, in which an $Nb_3Sn$ layer is formed by exposing the niobium parts to a tin vapor atmosphere at an elevated temperature of about 1000° C., there is the danger, however, that the niobium surface parts will only be coated nonuniformly. Thus, places with often finely distributed spotty shapes are observed on the completely coated surface portions, for instance, on which there are no, or only substantially thinner $Nb_3Sn$ layers. These disturbances can often be diminished by expensive additional measures such as, for instance, by pre-anodizing the surface portions in conjunction with a temperature lead of a tin source with respect to these surface portions. Through the simultaneous application of these two additional measures, values of the quality factor and the critical magnetic flux density of about the same magnitude can always be obtained, since it is presumed that the germination of the $Nb_3Sn$ layer occurs more homogeneously if the tin supply at the niobium surface is large, a tin source which is at a higher temperature than the niobium surface leads to a larger tin supply. On the other hand, an oxide layer initially prevents direct interaction of the tin with the metallic niobium. At temperatures of 600° C., however, the oxygen is absorbed by the niobium material, and a thin tin film then comes into contact with the metallic niobium. This leads to a dense, uniform $Nb_3Sn$ layer, since it has been determined that the anodized surface portions in partially anodized niobium samples are coated with a uniform $Nb_3Sn$ layer, while the surface portions which are not anodized are only coated incompletely.

However, it is difficult to apply the additional measures mentioned if the geometrical shape of the surfaces to be coated is not favorable, since they can have only a small effect at so-called shaded places and nonuniform coating with the disturbances mentioned can develop there, as before. This danger is particularly great, for instance in cavity resonators of the $TM_{010}$ type.

SUMMARY OF THE INVENTION

It is therefore an object of the present invention to provide a simpler manufacturing method for forming superconductive $Nb_3Sn$ layers on niobium surfaces for high frequency applications, in which the difficulties of the known methods are not present or only present to a negligible extent. In particular, uniform coating of the niobium surfaces is to be made possible without appreciable reduction of the quality factor and the critical magnetic flux density of the $Nb_3Sn$ layers produced by the method as compared to the known methods.

To solve this problem, it is provided, in a method of the kind mentioned at the outset, that, in the presence of a tin source, a tin vapor atmosphere which also contains additionally a highly volatile tin compound in the gaseous state, the saturation vapor pressure of which in a temperature range of between 200° and 1000° C. is substantially higher than that of tin at the same temperature, is developed by heating and that the surface portions to be provided with the $Nb_3Sn$ layer are kept in this atmosphere for a predetermined period of time at a temperature of between 900 and 1500° C.

The advantages of the method according to the present invention are in particular that the presence of a tin compound which is gaseous at the reaction temperature in the tin vapor atmosphere makes possible uniform coating of all the parts of the surface to be coated with $Nb_3Sn$ without the danger of shading. The method is particularly simple and the coating conditions are substantially less critical since, surprisingly, a temperature lead of the tin source and possibly also the pre-anodizing of the surface portions to be coated can be dispensed with. In addition, values of about the same magnitude of the quality factor $Q_o$ and the critical magnetic flux density $B_c^{ac}$ of the $Nb_3Sn$ layers can be obtained at any time. Thus, only unimportant variations of these values occur.

The temperature range between 900° and 1500° C. is particularly advantageous for the formation of the $Nb_3Sn$ layers. For, below about 900° C., there is the danger that undesirable high tin phases of the niobium tin system will be formed. Above 1500° C., on the other hand, the growth of the $Nb_3Sn$ layers can be controlled only with difficulty.

In the method according to the present invention, the heating for forming the $Nb_3Sn$ layer advantageously takes place in the presence of a tin source, since thereby, excessive evaporation of the tin from the niobium surface can be avoided and if necessary additional tin for forming the $Nb_3Sn$ layer can be replenished from the atmosphere of tin vapor and the gaseous tin compound.

It is advantageous to develop a tin vapor atmosphere which contains the tin compound in an amount such that during the heating, the vapor pressure of the tin compound is, at least for a short time, substantially higher than the vapor pressure of the tin. The vapor pressure of the tin compound, which is added or is formed first, can advantageously be at least ten times and preferably at least 50 times as high as the vapor pressure of the tin. Through this measure, nonuniform tin deposition on the surface portions to be coated is prevented.

In the manufacturing method according to the present invention, a gaseous tin compound can be admixed to the tin vapor atmosphere, for instance, by adding to the supply of the tin source, prior to the heating, a predetermined amount of an appropriate tin compound. A suitable tin compound is, particularly, a tin halogen such as $SnF_2$ or $SnCl_2$. Furthermore, other highly volatile substances can also be added, the vapor of which, when heated, reacts with the tin vapor produced by the tin source to form a corresponding tin compound. Hydrofluoric acid or hydrochloric acid, for instance, is suitable as such a substance. The compounds mentioned ensure a particularly uniform development of an $Nb_3Sn$ layer on the niobium surface parts.

In the method according to the present invention, the coating of the surface parts can be carried out in an evacuated, closed, for instance, sealed reaction chamber. However, an open reaction chamber can also be provided advantageously, as is proposed, for instance, in the co-pending U.S. patent application Ser. No. 705,418, filed July 15, 1976, now U.S. Pat. No. 4,061,573.

According to a further embodiment of the method of the present invention, the surface parts to be coated can advantageously be placed, together with the tin source, in a reaction chamber that can be evacuated, and this chamber can be heated, after being evacuated, in such a manner that the tin source is at a temperature higher than that of the surface parts for a predetermined time. With such a temperature lead of the tin source, relatively thick $Nb_3Sn$ layers can be developed.

According to a further embodiment of the present invention, the niobium surface parts can first be anodically oxidized before they are coated. With this process step, particularly uniform and thick $Nb_3Sn$ layers can be developed on the niobium surface parts.

With the anodic oxidation, a niobium pentoxide layer 0.01 to 0.03 $\mu m$ thick is advantageously generated on the portions of the niobium surface to be provided with the $Nb_3Sn$ layer. For, oxide layers less than 0.01 $\mu m$ thick do not yet show an advantageous effect on the properties of the $Nb_3Sn$ layer which develops later, while an undesirable oxide of grey color is easily formed in the anodic oxidation if a layer thickness of 0.3 $\mu m$ is exceeded.

Furthermore, the niobium surface parts can be held at the temperature between 900° and 1500° C. until an $Nb_3Sn$ layer with a thickness between 0.5 and 5 $\mu m$ is formed on them. The thickness of this layer can thus be adjusted by an appropriate heating time. On the one hand, such layers are thick enough that the electromagnetic fields and currents penetrate only into the $Nb_3Sn$ layer and not into the underlying niobium layer. For otherwise, the quality factor and the critical magnetic flux density of the surface parts in particular, would not be determined by the $Nb_3Sn$ layer but by the underlying niobium layer. On the other hand, the $Nb_3Sn$ layers of the thickness mentioned are again so thin that the dissipation heat produced in the $Nb_3Sn$ layer can be conducted into the niobium, the thermal conductivity of which is higher than that of $Nb_3Sn$, over a very short path, and from there to the coolant which is in contact with the niobium body during the operation of the device.

The high frequency properties of the $Nb_3Sn$ layer formed can be improved still further if an oxide layer is generated on the $Nb_3Sn$ layer produced and is subsequently dissolved again chemically. The generating and dissolving of the oxide layer can also be repeated several times (cf. IEEE Transactions on Magnetics, vol. MAG-11, No. 2, 1975, pages 420–422).

DETAILED DESCRIPTION OF THE INVENTION

Figure 1:
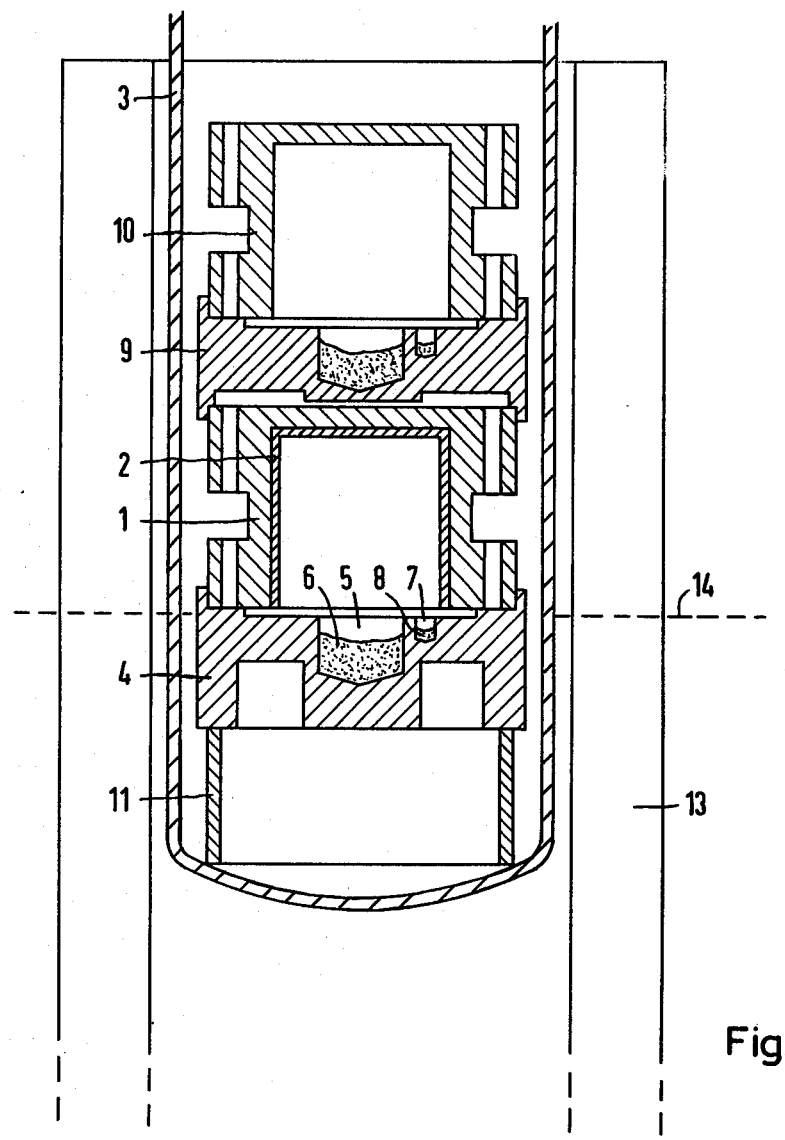
FIG. 1 is a cross sectional view of a portion of a reaction chamber suitable for carrying out the method according to the present invention.

The device shown as a longitudinal cross section in FIG. 1 contains a cup shaped part 1 of high purity niobium, which is provided for use as a cavity resonator of the $TE_{011}$-field type, in the shape of a circular cylinder. Part 1 is designed for an X-band frequency of 9.5 GHz and is described for instance, in the journal "Cryogenics" vol. 16 (1976), pages 17–24. The inside diameter and the inside height of this niobium part 1 are each, for instance, 41 mm. The surface portions to be coated, of the niobium part 1, are made very smooth by repeated polishing.

The method according to the present invention serves to prepare an $Nb_3Sn$ layer on the inside surface of the cup shaped niobium part 1. For this purpose, the inside surface of the niobium part can advantageously be provided, first, with a niobium pentoxide layer 2 by anodic oxidation. An appropriate method is known, for instance, from the U.S. Pat. No. 3,784,452. The thickness of the oxide layer so generated is advantageously between 0.01 and 0.3 $\mu m$ and preferably, about 0.1 $\mu m$. Subsequently the coated niobium part 1 is placed in a quartz tube 3, which forms an evacuated reaction chamber. The niobium part 1 is then placed on a lower part 4 also consisting of niobium, in the center of which a depression 5 is provided, in which a tin supply 6 is placed. The purity of the tin is advantageously better than 99.96%. The niobium part 1 and the lower niobium part 4 form a reaction zone which is delineated from the rest of the volume of the quartz tube 3 and contains the tin source 6 as well as the anodically oxidized inside surface 2 of the niobium part 1, which is to be provided with the $Nb_3Sn$ layer. The end face of the niobium part 1 rests on the surface of the lower niobium part 4. Besides the depression 5 provided in the lower part 4, a further, comparatively smaller depression 7 is provided, into which a predetermined small amount of a substrate 8 is placed. Advantageously, highly volatile tin compounds such as tin halogens, preferably tin fluoride or tin chloride, or also small amounts of other substances such as, for instance, hydrofluoric acid of hydrochloric acid which form a gaseous tin compound with tin vapor in the gaseous state can be provided as the substrate 8.

So that another resonator can be provided with an $Nb_3Sn$ layer in the same operation, a second lower niobium part 9, which corresponds to the lower niobium part 4 and on which a further cup-shaped niobium part 10 stands, is placed on the niobium part 1.

The quartz ampoule 3 with the parts 4, 1, 9 and 10, which are arranged on top of each other in a section of quartz tube 11 in towerlike fashion, is now evacuated at room temperature until a predetermined pressure prevails at its open end, not shown in the figure. At the beginning of the coating process, the quartz ampoule 3 is introduced into a vertical, tubular resistance furnace 13, which is only indicated in the figure and has a temperature of about 750° C. The temperature of the furnace is then increased to about 1050° C., so that the niobium parts gradually assume this temperature. In this process, part of the tin from the tin source 6 evaporates, and the highly volatile substrate 8 evaporates completely. Thus, an atmosphere consisting of tin vapor and the vapor of the tin compound develops. The amount of substrate is advantageously selected so that the vapor pressure of the tin compound is at least 10 times, and preferably 50 times higher than the tin vapor pressure.

The niobium parts are then kept at the temperature of 1050° C. for a predetermined time, say, 3 hours. During this time, an $Nb_3Sn$ layer of high quality and high critical magnetic flux density develops on the inside surface of the niobium part 1. The thickness of the $Nb_3Sn$ layer generated can be influenced by the length of this reaction time. This time is advantageously chosen so that the thickness of this layer is between 0.5 and 5$\mu m$.

By an optionally provided temperature lead of the tin source, i.e., by heating the tin source more than the surface parts of the niobium parts 1 to be coated, the thickness of the $Nb_3Sn$ layer on these surface parts can likewise be influenced distinctly. In the method according to the present invention, such a process step which is accompanied by considerable expense, is not absolutely necessary, however. Also with the temperature lead, uniform if relatively then $Nb_3Sn$ layers can be obtained. A temperature lead of the tin source can be achieved, for instance, by inserting the quartz tube 3 into the furnace 13 only far enough that the tin source 6 is located at the height of the upper edge of the furnace. This position of the upper edge is indicated in the figure by a broken line 14.

If the process parameters are chosen so that excessively thick $Nb_3Sn$ layers are obtained, this hardly has an effect on the quality factor and the critical flux density of these layers, as layers that are too thick can be worked down to their optimum layer thickness by oxypolishing.

After the end of the reaction time, the quartz ampoule is slowly cooled down and the $Nb_3Sn$ layer cleaned.

The $Nb_3Sn$ layers produced in this manner can advantageously be given a post treatment in accordance with the U.S. Pat. No. 3,902,975 by generating on them an oxide layer by anodic oxidation and subsequently dissolving this layer again chemically.

The measurement results of two tests in accordance with the above-described method according to the present invention are given in the Table following the test descriptions.

FIRST TEST

In the first test, the inside surface of the niobium part was provided by anodic oxidation with a niobium pentoxide layer about 0.1 $\mu m$ thick. After evacuating the quartz ampoule 3 at room temperature, the ampoule was lowered into a tubular resistance furnace 13 with a temperature of about 1050° C. far enough that the upper edge of the niobium part 4 was lined up with the upper edge of the furnace 13. The arrangement was left in this position for 1 hour, while the niobium parts 4, 1, 9 and 10 were heated to different temperatures which were decreasing toward the top but were approximately homogeneous within the respective part. Between the cup-shaped niobium part 1 and the niobium part 4 with the tin source 6 and the substrate 8, a temperature difference of about 600° then adjusted itself after about 12 minutes. This temperature difference became smaller as the heating continued. After one hour, the temperature of the lower niobium part 4 was about 830° and the temperature of the niobium part 1 about 750°.

After this heating-up time with a temperature lead of the tin source 6, the quartz ampoule was lowered completely into the furnace 13. Provision was made by additional measures that the temperature of the furnace in the vicinity of the tin source 6 was 1100° C., so that the temperature of the tin source was slightly higher, i.e., by several °C., during the subsequent main reaction time, which lasted about three hours. 40 μg tin fluoride were used as the substrate 8. The Nb$_3$Sn layer prepared by this method was relatively thick and was therefore subjected to oxy-polishing.

SECOND TEST

Contrary to the first test, the temperature lead of the tin source compared to the niobium surface parts to be coated was only insignificantly pronounced. The thickness of the Nb$_3$Sn layer obtained was therefore less. The other test conditions corresponded to those of the first test.

Table

| Test No. | Q 4,2 K B=1mT | 4,2 K B=B$_a^{ac}$ | 1,5 K B=1mT | 1,5 K B=B$_a^{ac}$ | $B_c^{ac}$ [mT] 4,2 K | 1,5 K |
|---|---|---|---|---|---|---|
| 1 | 1,7.10$^9$ | 9,0.10$^8$ | 4,6.10$^9$ | 3,7.10$^8$ | 79,2 | 79,6 |
| 2 | 1,3.10$^9$ | 6,9.10$^8$ | 2,2.10$^9$ | 1,5.10$^8$ | 89,4 | 88,0 |

Figure 2:
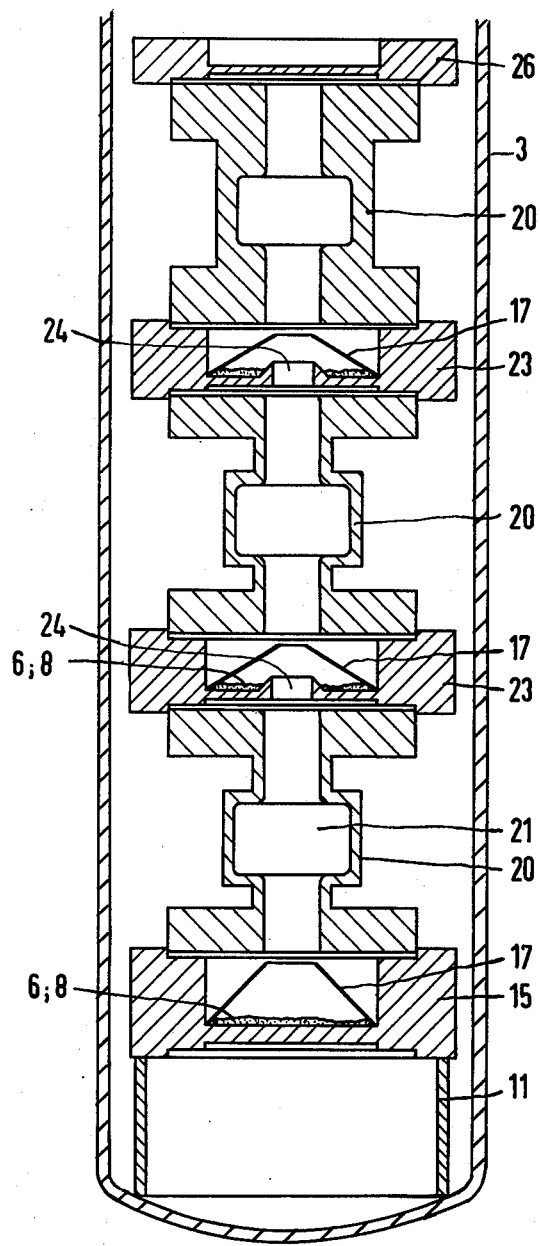
FIG. 2 is a similar view of a further embodiment of such a chamber.

Besides resonators of the TE$_{011}$ type as per FIG. 1, particularly other resonators, e.g., such of the TM$_{010}$ type or resonator helices can also be provided with Nb$_3$Sn layers of high quality and high critical magnetic flux density by means of the method according to the present invention. A corresponding device is indicated in FIG. 2.

On the bottom of the vertical quartz tube 3, which is detailed only in part as a longitudinal cross section, stands a spacer tube 11 of quartz on which a cup-shaped lower niobium part 15 is arranged. At the bottom of the lower niobium part, a tin supply 6 is provided, to which a small amount of a highly volatile substrate 8, for instance, 20 μg tin fluoride, is admixed. Over this mixture is placed a niobium cover sheet 17 which has the shape of a truncated cone. Through its upper central opening 18, a gas mixture of tin and a tin compound can get, when the tin source 6 and the substrate 8 are heated up, into a niobium resonator 20 of the TM$_{010}$ type which stands on the lower niobium part 15, and can fill the interior of the former. A corresponding resonator is described, for instance, in the journal "Cryogenics" vol. 16 (1976), pages 17–24. For developing the atmosphere from the vapor of the tin and the tin compound, the device is inserted into a furnace, not shown in the figure, which is preheated, for instance, to 750° C. The furnace may correspond to the furnace 13 of FIG. 1. Subsequently, the temperature of the device is increased to at least 900 and at most 1500° C., and preferably to 1050° C., to produce a uniform Nb$_3$Sn layer on the inside surfaces of the niobium resonators 20.

So that other resonators can be provided with an Nb$_3$Sn layer in the same operation, an intermediate niobium part 23 is placed on the lowest resonator 20; this intermediate part corresponds substantially to the lower niobium part 15 and is provided with a central hole 24. On the ring-shaped bottom of the intermediate niobium part 23 is again arranged a supply of tin 6 and of a substrate 8. On this intermediate part 23 stands a further resonator 20. According to the illustration, still another intermediate niobium part 23 and a further resonator 20 are arranged on this resonator. The uppermost resonator 20 is closed off by a niobium cover 26. Advantageously, a further quartz ampoule, which is filled with quartz wool prior to insertion and is evacuated and closed off by sealing, can furthermore be inserted and placed on the niobium cover 26 by means of a section of quartz tube. This additional quartz ampoule serves for radiation protection. The radiation protection ampoule, not shown in the figure, must be designed so that the evacuation of the lower part of the quartz ampoule 3 is not impeded. In order to further ensure uniform pumping off of the interiors of the resonators 20 from the open end of the quartz tube 3, it is advantageous to provide an annular gap between the resonators and the intermediate niobium parts 23 resting against them the bottommost resonator and the lower niobium part 15 resting against it and uppermost resonator and the niobium cover 26.

Especially with the unfavorably shaped resonators of the TM$_{010}$ type it is found that uniform coating of their inside surfaces is possible with the method according to the present invention without shaded places and defective Nb$_3$Sn layers developing in the corners of the resonator cavity.

Besides the possible locations shown in the figures for the substrate 8, the latter can also be placed in the cavity formed by the resonator. It is furthermore possible to first dissolve the substrate in a suitable liquid which does not attack the niobium surface and then to rinse out the resonator cavity with this solution. The cavity walls to be coated can be coated in this manner with a film of the solution, which evaporates when heated. In addition, the substrate can also be precipitated on the surface parts to be coated by evaporation in the form of a deposit before the niobium parts are placed in the reaction chamber. A suitable highly volatile substance can also be fed to the reaction zone in gaseous form via a pipe connection while the latter is already at elevated temperature. One thereby temporarily obtains in an advantageous manner a particularly steep increase of the absolute pressure within the reaction zone.

What is claimed is:

1. In a method for the manufacture of a superconductive Nb$_3$Sn layer on a niobium surface for high frequency applications by diffusing tin into the niobium surface at elevated temperature, the improvement comprising:
   (a) developing a tin vapor atmosphere which also contains a highly volatile tin compound in the gaseous state, the saturation vapor pressure of which in a temperature range between 200 and 1000° C. is substantially higher than that of the tin at the same respective temperature, by heating in the presence of a tin source; and,
   (b) holding the surface portions to be provided with the Nb$_3$Sn layer at a temperature of between 900 and 1500° C. for a predetermined period of time in said atmosphere for forming the Nb$_3$Sn layer.

2. The improvement according to claim 1 wherein said step of developing further comprises developing a tin vapor atmosphere which contains the tin compound in an amount such that the vapor pressure of this tin compound is substantially higher than the vapor pressure of the tin during the heating, at least for a short time.

3. The improvement according to claim 2, wherein an atmosphere consisting of tin vapor and a gaseous tin compound is developed, the vapor pressure of which is between 10 and 50 times the vapor pressure of the tin.

4. The improvement according to claim 1 wherein said tin compound is added to the tin vapor atmosphere.

5. The improvement according to claim 4 wherein said tin compound is a tin halogen.

6. The improvement according to claim 1 wherein said tin compound is obtained by adding a substance, which in the gaseous state forms a highly volatile tin compound with the tin vapor, to the tin vapor atmosphere.

7. The improvement according to claim 6 wherein said substance is hydrofluoric acid or hydrochloric acid.

8. The improvement according to claim 1 wherein said step of developing includes adding a predetermined amount of a highly volatile tin compound or a substance which in the gaseous state forms a highly volatile tin compound to the tin supply of the tin source prior to the heating.

9. The improvement according to claim 1 for coating the cavity formed by a resonator wherein said step of developing includes placing a predetermined amount of a highly volatile tin compound or a substance which in the gaseous state forms a highly volatile tin compound in the cavity prior to the heating.

10. The improvement according to claim 9 wherein said step of placing comprises rinsing the surface parts which are to be coated with $Nb_3Sn$ layer with a solution in which the highly volatile tin compound or the substance is dissolved to coat the parts with a film of said solution prior to the heating.

11. The improvement according to claim 1 and further including the step of anodically oxidizing said surface parts to be provided with the $Nb_3Sn$ layer prior to forming said layer.

12. The improvement according to claim 11 wherein a niobium pentoxide layer 0.01 to 0.3 $\mu$m thick is produced by the anodic oxidation.

13. The improvement according to claim 1 and further comprising placing the surface portions on which the $Nb_3Sn$ layer is to be deposited together with the tin source in a reaction chamber that can be evacuated, evacuating said chamber, and, after evacuation, heating said chamber in a manner such that the tin source is at a temperature higher than that of the surface portions for a predetermined time.

14. The improvement according to claim 1 wherein said step of holding comprises holding the niobium surface parts at a temperature between 900° and 1500° C. until an $Nb_3Sn$ layer with a thickness of between 0.5 and 5 $\mu$m is formed on them.

15. The improvement according to claim 1 and further including the step of polishing the $Nb_3Sn$ layer formed by generating thereon by anodic oxidation an oxide layer and subsequently dissolving said oxide layer chemically.

* * * * *